United States Patent [19]

Carpenter et al.

[11] 4,045,736
[45] Aug. 30, 1977

[54] METHOD FOR COMPOSING ELECTRICAL TEST PATTERNS FOR TESTING AC PARAMETERS IN INTEGRATED CIRCUITS

[75] Inventors: Robert Gordon Carpenter; Chester C. Chao, both of Poughkeepsie, N.Y.

[73] Assignee: IBM Corporation, Armonk, N.Y.

[21] Appl. No.: 184,145

[22] Filed: Sept. 27, 1971

[51] Int. Cl.[2] .............................................. G01R 31/22
[52] U.S. Cl. ............................... 324/158 R; 324/73 R
[58] Field of Search ............. 324/158 T, 158 R, 73 R; 235/153 AC

[56] References Cited

U.S. PATENT DOCUMENTS 3,655,959 4/1972 Chernow et al. .................. 324/73 R

OTHER PUBLICATIONS

Roth et al., "Programmed Algorithms . . . "; IEEE Trans. on Elect. Computers; Oct. 1967, pp. 567-580.

*Primary Examiner*—Rudolph V. Rolinec
*Assistant Examiner*—Ernest F. Karlsen
*Attorney, Agent, or Firm*—J. B. Kraft

[57] ABSTRACT

A method is provided for generating electrical test patterns for testing functional AC parameters of integrated semiconductor circuits from the test patterns used for the more conventional testing of the DC parameters of such circuits. The AC parameters include such factors as rise time, fall time and circuit delays.

Starting with a DC pattern known to be sufficient for the DC testing of the circuit to be tested, each increment of the DC pattern which comprises a plurality of parallel bilevel signals is applied to a corresponding plurality of input points in a standard of the circuit, preferably computer simulated. The resulting output is sensed at output points in the circuit standard. Then, one by one, the input signals in the applied increment are changed while the remainder of the signals are maintained at their original levels. When a change in one of the signals produces a corresponding change in the output, this is noted as path for AC testing. Then, there is stored as the first AC increment, a signal pattern wherein all the signals in the increments are maintained at their original levels except the input producing the change in output, which is stored as a pulsed signal. The procedure is repeated for a plurality of signals in the increment and for a plurality of remaining increments in the DC pattern until an AC signal pattern is developed in which all the input points in the circuit standard are pulsed at least once.

14 Claims, 3 Drawing Figures

METHOD FOR COMPOSING ELECTRICAL TEST PATTERNS FOR TESTING AC PARAMETERS IN INTEGRATED CIRCUITS

BACKGROUND OF THE INVENTION

The present invention relates to the testing of integrated non-linear circuits, and more particularly, it relates to testing of the AC parameters of such circuits. Functional testing of the DC parameters of large scale integrated circuits is well developed in the art. In such functional testing, the integrated circuits are tested in order to determine the ability of the integrated circuit to fulfill the basic functions for which they were designed. These DC functional tests include tests for switching thresholds, saturation levels, the size of the load which the circuit is capable of driving and the immunity of the circuit to noise.

Such DC functional tests are usually performed directly on the integrated circuit chip or a computer simulation of the chip by applying to specific input points or contact terminals of the integrated circuit chip a DC signal pattern and monitoring a resulting DC pattern at output points or other terminals on the integrated circuit chip. In such DC testing, the test pattern is a bilevel input electrical signal pattern made up of a plurality of pattern increments, in sequence, each increment comprising a plurality of parallel bilevel signals corresponding to the plurality of input points in the circuit to be tested. A corresponding resulting output signal is sensed at the plurality of output points in the circuit being tested.

Suitable methods and apparatus for automatically generating such test patterns for testing the DC functional parameters of complex non-linear integrated circuits are known in the art. Copending application Ser. No. 825,870, filed May 19, 1969, for a "Logic Test System", assigned to the same assignee of the present application, describes a method and apparatus for generating a highly rapid sequence of randomly varying or pseudo-randomly varying DC bilevel pattern increments for testing complex integrated circuits.

While DC functional testing of complex integrated circuits has been extensively implemented in the semiconductor circuit field, the testing of AC parameters, which includes such factors as rise time, fall time and circuit delays, has been in relatively limited usage, particularly in the case of large scale integrated circuits. One reason appears to be the scarcity of systems for the generation or composition of AC test patterns for integrated circuits by wholly automated or partially automated methods. On the other hand, while simple test patterns for AC parameters for relatively simple integrated circuits may be composed manually, in the case of the more complex large scale integrated circuits, manual composition of AC test patterns becomes an exceedingly difficult, costly and lengthy task.

SUMMARY OF THE INVENTION

Accordingly, it is a primary object of the present invention to provide a system for automatically generating or composing test patterns for the AC parameters in non-linear integrated circuits.

It is another object of the present invention to provide such a system which is capable of automatically converting to an AC test pattern, a DC test pattern comprising a plurality of pattern increments, in sequence, which increments comprise a plurality of parallel bilevel DC signals.

It is yet another object of the present invention to provide a system for automatically converting a test pattern for the DC functional parameters of a circuit into a test pattern for AC parameters of the same circuit.

The present invention provides a method for generating or composing a test pattern for testing the previously described AC parameters in integrated circuits. This is accomplished by automatically converting DC test patterns or portions of DC test patterns into what we will refer to as AC test patterns. The DC test pattern which we initially have comprises a plurality of increments, each of which comprises a plurality of parallel bilevel signals. Each signal is respectively applied to one of a plurality of input points in a standard of the circuit to be tested. A resulting output signal is then sent at at least one output point in the circuit standard. Then, one by one, the levels of each of the parallel signals in the applied increment is changed from its original level to the other of its two levels, while the remaining parallel signals are maintained at their original levels. With each change, it is determined whether a corresponding change in at least one bilevel output signal occurs. If such a change occurs, we have, in effect, found a sensitive path between the pin or input point to which the particular change input signal is applied and the correspondingly changed output point. This path should be suitable for testing the AC parameters with respect to that particular input point or pin. Accordingly, there is recorded and stored an AC signal increment in which the remaining or unchanged signals in the particular original DC increment are maintained at their original DC value, while the changed signal is replaced with a pulsed signal.

The procedure is repeated by changing the level of different ones of said parallel signals in the input increment while maintaining the remaining signals at their original levels until one of the changes produces a corresponding output signal change. Then, there is recorded and stored as an additional increment of the AC test pattern, an increment in which the change producing signal is pulsed and the remaining signals are maintained at their original levels. After all or at least a substantial number of the parallel signals in the particular applied increment have been changed and the effect on the output signal determined, as described above, the next increment of the DC signal pattern is applied to the circuit standard, and the procedure is repeated until there is recorded and stored a plurality of AC test pattern increments such that there is at least one AC pattern increment in which a pulse signal is applied to each of the input points pre-selected to be AC tested.

The foregoing and other objects, features and advantages of the invention will be apparent from the following more particular description and preferred embodiments of the invention as illustrated in the accompanying drawings.

DESCRIPTION OF THE PREFERRED EMBODIMENTS

Figure 1:
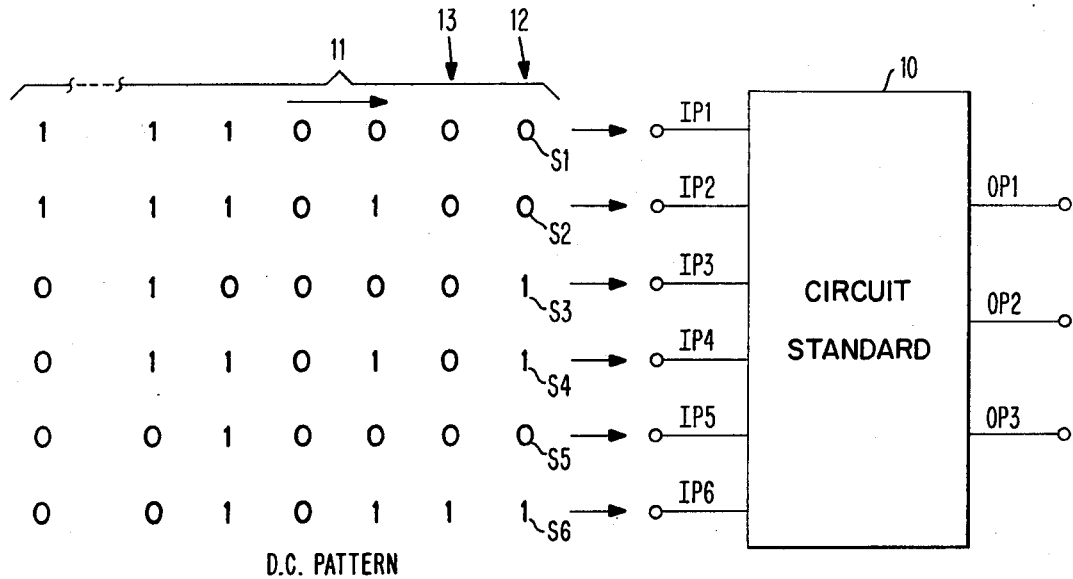
FIG. 1 is a generalized, block diagram of the circuit standard to be tested and of the incremental DC pattern to be sequentially applied to the circuit standard so that an AC test pattern may be generated therefrom.

With reference to FIG. 1, circuit standard 10 contains a plurality of input points, designated IP1 through IP6, and a plurality of output points, designated OP1 through OP3. The circuit standard is preferably a computer simulation of the circuit to be tested. However, a hardware simulation of the circuit or an actual circuit known to be "good" may be used as a substitute. The simulation of circuits on the computer is well known to circuit designers. A DC test pattern 11 is represented by a plurality of increments, in sequence, each increment comprising six signals S1 through S6 which are either at the 1 or 0 binary levels.

For purposes of illustration, let us assume that we have a DC test pattern which has been generated, as described in copending application Ser. No. 825,870, for the purpose of testing the DC functional parameters of the circuit standard 10. Let us further assume that the DC pattern comprises forty increments of six parallel signals (S1 to S6) each. We will now describe the system with respect to the flow chart in FIG. 2, as well as the DC pattern and standard circuit of FIG. 1. The input to the system is the DC test pattern, block 20. As a first step, block 21, the number of pattern increments $n$ which is equal to 40 is put into counter No. 1. Next, as described in block 22, the first DC signal pattern increment 12, comprising six parallel signals S1 through S6, is applied to the corresponding input points IP1 through IP6 in the circuit standard. Then one is subtracted from the increment counter, counter No. 1, block 23, and then $m$, the number of parallel signals, is placed in counter No. 2, block 24. Thus, the number 6 is placed into counter No. 2. In accordance with the next instruction on the flow chart, block 25, the binary signal at the Wth input point in the reference is changed. As indicated, W is the number remaining in counter No. 2. Since the number in counter No. 2 is 6, signal S6 in the first pattern increment 12 is changed from a 1 to a 0. Next, one is subtracted from counter No. 2, block 26, so the number remaining in counter No. 2 or W is now 5. All the other signals in the first increment 12 remain at their initial level.

It is now noted whether there is any change in any of the output points OP1 through OP3 as per the decision block in the flow chart. If there is no change, the changed input signal S6 is returned to its original value, i.e., changed back from a 0 to a 1, block 28. Next, it is determined, in decision block 29, whether the number in counter No. 2 that is indicative of the number of signals in the pattern increment, S1 through S6, remaining to be tested, is equal to zero. Since it is not, the system is returned to point B, input to block 25, and again the signal applied to the W input point, i.e., input point IP5, is changed from a 0 to 1. Counter No. 2 is reduced by one, block 26, and the number now in counter No. 2 is 4. Again, the decision is made in block 27 as to whether or not the change of signal S5 applied to input point IP5 produces any change in the output. Let us assume that this time there is a change in the output, i.e., a "Yes" decision from block 27. Assume that output point OP2 changes from a 1 to a 0. The system now assumes that a sensitive path has been found that, when in pattern increment 12, signal S5 is changed from a 0 to a 1 and the remaining signals are maintained at their original levels, output point OP2 undergoes a corresponding change from a 1 to a 0. As a result, the "Yes" path is taken from the decision box, the input signal is returned to its original level, block 32, and there is stored in the computer, as per block 29, as the first AC pattern increment, the following increment: parallel signal of 0, 0, 1, 1 and 0 are respectively applied to input points IP1, IP2, IP3, IP4 and IP6, while a pulsed signal is applied to input point IP5. This pulsed signal should produce a corresponding pulsed signal on output point OP2 of the circuit standard. This pulsed signal is one which will oscillate from the 0 to 1 levels at a preselected rate in the order of microsecond or even nanosecond pulse widths depending on the nature of the circuit to be tested. Next, a decision is again made as to whether counter No. 2, which is keeping track of the parallel signals being changed, is equal to zero, block 30. Since it is not, the system is again returned to point B, and the next parallel signals changed, and so on. This procedure is repeated until counter No. 2 is equal to zero. At this point, a decision is made, block 31, as to whether counter 1 = 0. Since the decision is No, the program is returned to point A where the next DC increment 13 is applied to input points IP1 through IP6 in the circuit standard, and the procedure is repeated with respect to the six signals in increment 13.

In this manner, the program may be continuously relooped until there is stored a sufficient number of AC test pattern increments so that there is at least one increment wherein a pulsed input is applied respectively to each of input points IP1 through IP6. Thus, in the illustration being considered, the AC test pattern composed would have at least six increments. However, it may be preferable that the AC test pattern have more than six increments and the advantages of such additional increments, as well as how the number of additional increments necessary may be minimized, will be described hereinafter in greater detail, particularly with respect to FIG. 3. However, in the meantime, with respect to FIG. 2, the procedure will continue until both counter No. 2 and counter No. 1 are equal to zero.

Figure 2:
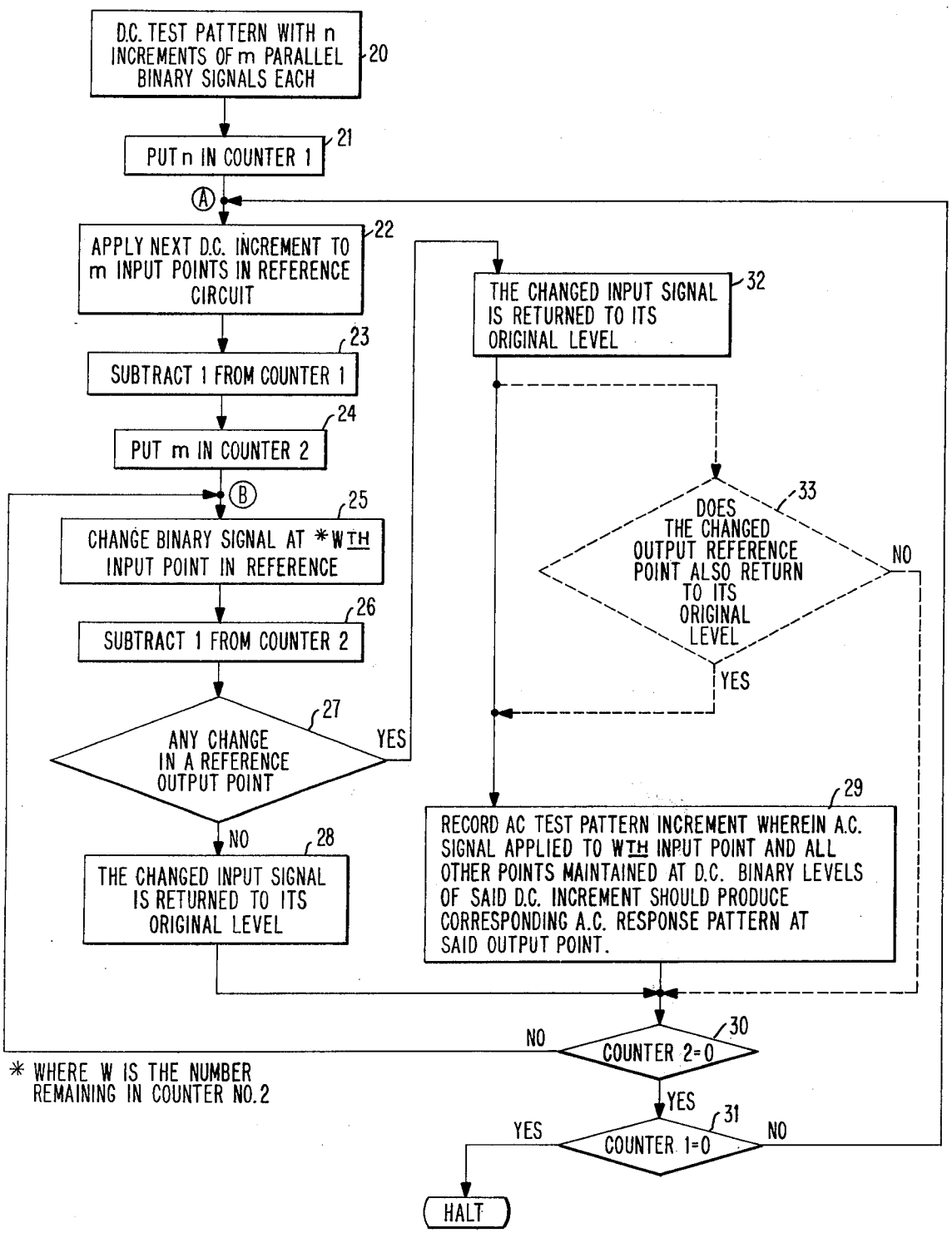
FIG. 2 is a flow chart of the system utilized for the composition of an AC test pattern in accordance with the present invention.

In order to insure that the AC path between a particular input point and an output point is a valid one, particularly in the case of sequential circuits, there is provided, in accordance with a variation in the program shown in FIG. 2, additional steps for insuring that a sensitive path does exist between the change in signal at a particular input point and a corresponding change in signal at a particular output point. This variation in steps is shown by the dotted lines in FIG. 2. When it is determined that a change in signal applied to a given input point produces a corresponding change in the signal monitored at a particular output point in decision block 27, instead of recording the AC test pattern as indicated in FIG. 2, the input signal is returned to its original level, block 32, and then the output signal is again monitored, in decision block 33, to determine whether or not the changed output point also returns to its original level. If it does, then an AC test pattern increment is recorded, as previously described and shown in FIG. 2. On the other hand, if it does not, the AC test pattern is not reported and the procedure is continued in accordance with the NO branch shown in dotted lines in FIG. 2.

Based upon the present state of the art, the control aspects of the present invention are preferably practiced under the control of a programmed general purpose digital computer, such as the IBM 1130 or the IBM 360 computer. The system shown in FIG. 2 is a high level flow chart of a preferred program for instrumenting the digital computer in order to carry out the control operations of the present invention. The flow chart comprises a number of functional blocks and decisional blocks representing respective computer operations. Standard programming techniques, forming no part of the present invention, can be employed to reduce the high level flow chart of FIG. 2 into equivalent machine language instructions in a known manner. It will be recognized, of course, that only the control oriented portion of the programming in the general purpose computer which is directed to the present invention is represented in the flow chart of FIG. 2. In addition, there is provided in the general purpose computer the customary system software including machine control, housekeeping, job organizing, program loading, and language translation programs. Such system software is well known and is not required for an understanding of the invention.

Block 20 in FIG. 2 represents the data input to the computer. We have previously mentioned that the DC test pattern may be generated by hardware, as described in copending application Ser. No. 825,870. Of course, as is well known in the art, DC test patterns may also be computer generated.

Let us now assume that we have run the entire DC pattern, previously described having 40 increments, through the program and have stored a number of AC test pattern increments which we have composed in accordance with said program. We mentioned previously that we would preferably have an AC pattern increment wherein a pulse is applied for each of the input points IP1 through IP6. Now, it may be that after running through the entire DC pattern, we have more than one AC increment in which a particular input point is pulsed. Such additional AC test pattern increments will be of value in the AC testing of the circuit if they are not redundant, i.e., they do not follow an identical path through the circuit. In determining redundancy with respect to two such AC test pattern increments, wherein the same input point is pulsed, if different output points are pulsed, the two patterns are not redundant because different circuit paths must be taken in order to get to the different output points. For example, suppose we have two AC pattern increments in which input point IP2 is pulsed. If as a result of one of the increments output point OP1 has a pulsed response, while as a result of the other AC increment output point OP3 has a pulsed response, these are not redundant AC pattern increments and neither should be discarded. On the other hand, if a pulse on the same input pin in two AC patterns results in a corresponding pulse on the same output pin, we may usually assume that these are redundant and one of the two may be discarded.

However, even in the latter case, the path through the internal circuitry may have been different due to DC bias conditions of other inputs. If the simulation of the circuit on the computer is such that the state of internal circuit nodes, that is, circuit nodes other than the input and output points, can be determined, the system of the present invention will have the further capability in determining the redundancy of AC test pattern increments of actually examining the effect of the increment on internal circuit nodes.

In other words, if in addition to determining how changes in signals in DC increments apply to given input points affect given output points, we can further determine how these changes in input signals affect internal nodes within the circuit, we should be better able to determine whether the automatically generated AC pattern increments are redundant.

Figure 3:
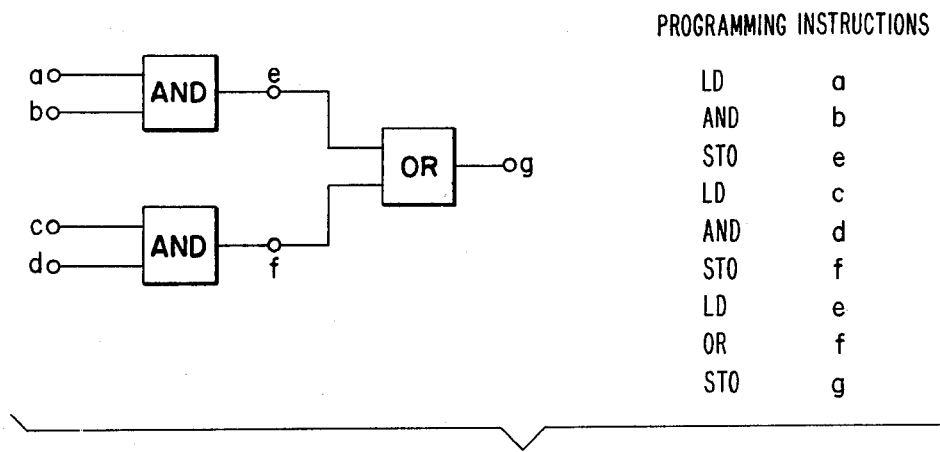
FIG. 3 is a block diagram together with attendant programming instructions in order to illustrate how a portion of a circuit may be computer simulated so that the internal nodes of the circuit are known, in addition to the input and output points of the circuit.

Because the implementation of simulated circuits on a computer in which not only the bilevel state of input and output points but also the bilevel status of internal nodes may be determined are well known in the art, we will not here describe such systems in detail. However, just by way of simple illustration, there is shown in FIG. 3 the programming instruction for simulating the circuit portion shown in block diagram, so that internal nodes $e$ and $f$ are known in addition to input points $a$, $b$, $c$, $d$ and output point $g$. The programming instructions are as follows:

Load $a$
And $b$ with $a$
Store $e$
Load $c$
And $d$ with $c$
Store $f$
Load $e$
Or $f$ with $e$
Store $g$ The simulation of the circuit standard is, of course, preferably simulated on the computer used for the implementation of the system of FIG. 2.

While in the illustration shown in FIG. 1 and described in FIG. 2, all of the input points in the circuit standard are to be tested in the AC pattern, it should, of course, be recognized that in certain circuits, the AC parameters of one or more of the input points may not be significant and need not be AC tested. In such situations where an AC pattern increment for that particular input point is not necessary, the DC signal applied to that particular input point need not be changed in accordance with the system shown in FIG. 2 in composing the AC pattern.

We have found that when starting with DC test patterns known to be of sufficient scope to satisfactorily test the DC parameters of the circuits, and utilizing the system of the present invention, suitable test patterns for testing the AC parameters of the circuit may be readily generated or composed.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for composing electrical test patterns for testing AC parameters in integrated semiconductor circuits comprising:
    applying to a plurality of input points in a standard of the circuit to be tested, the first increment of a bilevel DC electrical signal input pattern, the increments of which each comprise a plurality of parallel bilevel signals, each signal being respectively applied to one of said plurality of input points;
    sensing, as at least one output point in said circuit standard, the bilevel output signal resulting from said input pattern increment;
    changing the level of one of said parallel signals in said increment from its original level to the other of the two levels while maintaining the remaining parallel signals at their original levels;

determining whether said change in said input increment signal produces a corresponding change in one bilevel output signal;

if there is such a change in said output signal, storing, as part of said AC test pattern being composed, an increment comprising said bilevel DC increment in which said signal which produced the change is pulsed and the remaining signals are maintained at their original levels, said AC increment providing a test for the input point to which said pulsed signal is applied;

repeating said procedure by changing the level of different ones of said parallel signals in said input increment while maintaining the remaining signals at their original levels until one of said changes produces a corresponding output signal change and then recording and storing, as part of an AC test pattern, an increment in which the change producing signal is pulsed and the remaining signals are maintained at their original levels;

then applying to said plurality of input points, a second increment of said DC signal input pattern, and repeating said procedure of determining whether changing the level of different ones of the parallel signals in said second increment produces a corresponding output change, and then storing and recording an appropriate AC pattern increment in accordance with said procedure; and, repeating said procedures of changing different ones of parallel signals in a sequence of applied DC input pattern increments until there is recorded and stored a plurality of the AC test pattern increments such that there is at least one AC pattern increment in which a pulsed signal is applied to each of the input points preselected to be AC tested.

2. The method of claim 1 wherein the procedure of changing the level of different ones of said parallel signals in each input increment is carried out so that all of the parallel signals in said pattern increment have their level changed before a subsequent increment of the DC signal pattern is applied and subjected to said procedure.

3. The method of claim 1 wherein the bilevel DC electrical signal input pattern utilized is one known to be sufficient to test the DC parameters of the circit to be tested.

4. The method of claim 1 wherein in each case where it is determined that a change in the level of the input increment signal produces a corresponding change in a bilevel output signal, the changed input signal is then returned to its original level, and only if the changed output signal undergoes a corresponding change to its original level is the DC signal increment converted into an AC increment in accordance with the procedure described in claim 1.

5. The method of claim 4 wherein all of the input points are preselected to be AC tested.

6. The method of claim 1 wherein said standard of the circuit to be tested is a computer simulation of said circuit and said input and output points are computer simulated.

7. The method of claim 6 wherein said computer simulation further includes a plurality of circuit nodes intermediate said input and output points, which nodes are represented as being at one of said two bilevel DC signal levels.

8. The method of claim 7 wherein when there is a change in the output signal, attendant changes at said intermediate circuit nodes are also examined and one of any two input pattern increments, in which a change in level of corresponding signals produces a corresponding change in the output signal, is discarded from the AC signal pattern if the two input increments produce signal levels at all intermediate nodes which correspond to each other.

9. A system for generating electrical test patterns for testing AC parameters in integrated semiconductor circuits comprising:

a standard of the circuit to be tested;

means for applying to a plurality of input points in said standard of the circuit the sequential increments of a bilevel DC electrical signal input pattern, the increments of which each comprise a plurality of parallel bilevel signals, each signal being respectively applied to one of said plurality of input points;

means for sensing, at at least one output point in said circuit standard, the bilevel output signal resulting from the input pattern increment being applied;

means for sequentially changing the level of different ones of said parallel signals in said increment from its original level to the other of the two levels, while maintaining the remaining parallel signals at their original levels while a given one of said parallel signals is being changed;

means for determining whether said change in said input increment signal produces a corresponding change in one bilevel output signal; and means, activated by such a change in said output signal, for storing, as part of said AC test pattern being generated, an increment comprising said bilevel DC increment in which said signal which produced the change is pulsed and the remaining signals are maintained at their original levels, said AC increment providing a test for the input point to which said pulsed signal is applied.

10. The system of claim 9 wherein the means for changing the level of different ones of said parallel signals in said input increment change all of the parallel signals in said pattern before a subsequent increment of the DC signal pattern is applied.

11. The system of claim 9 wherein the bilevel DC electrical signal input pattern is one known to be sufficient to test the DC parameters of the circuit to be tested.

12. The system of claim 9 further including means activated by a change in said output signal for returning the changed input signal to its original level, and wherein said means for storing said AC increment are activated only if the changed output signal undergoes a corresponding return to its original level.

13. The system of claim 9 wherein said standard of the circuit to be tested is a computer simulation of said circuit and said input and output points are computer simulated.

14. The system of claim 13 wherein said computer simulation further includes a plurality of circuit nodes intermediate said input and output points, which nodes are represented as being at one of said two bilevel DC signal levels.

* * * * *